United States Patent [19]
Benveniste et al.

[11] Patent Number: 5,198,676
[45] Date of Patent: Mar. 30, 1993

[54] ION BEAM PROFILING METHOD AND APPARATUS

[75] Inventors: Victor M. Benveniste, Magnolia; Peter L. Kellerman, Essex; John J. Schussler, Somerville, all of Mass.

[73] Assignee: Eaton Corporation, Cleveland, Ohio

[21] Appl. No.: 767,027

[22] Filed: Sep. 27, 1991

[51] Int. Cl.⁵ .......................................... G01N 23/00
[52] U.S. Cl. .................................. 250/397; 250/398; 250/492.2
[58] Field of Search ............... 250/397, 398, 492.2 R, 250/492.21, 492.3, 492.1

[56] References Cited

U.S. PATENT DOCUMENTS

| | | | |
|---|---|---|---|
| 4,234,797 | 11/1980 | Ryding | 250/492.1 |
| 4,494,005 | 1/1985 | Shibata et al. | 250/397 |
| 4,598,323 | 7/1986 | Honjo et al. | 358/285 |
| 4,608,493 | 8/1986 | Hayafugi | 250/397 |
| 4,628,209 | 12/1986 | Wittkower | 250/492.2 |
| 4,724,324 | 2/1988 | Liebert | 250/397 |
| 4,726,587 | 2/1988 | Fitch | 273/54 E |
| 4,751,393 | 6/1988 | Corey et al. | 250/492.21 |
| 4,775,796 | 10/1988 | Purser et al. | 250/492.2 |
| 4,800,100 | 1/1989 | Herbots et al. | 427/38 |
| 4,904,902 | 2/1990 | Tamai | 315/111.81 |
| 5,068,539 | 11/1991 | Nogami et al. | 250/492.2 |

Primary Examiner—Jack I. Berman
Assistant Examiner—Jim Beyer
Attorney, Agent, or Firm—Watts, Hoffmann, Fisher & Heinke

[57] ABSTRACT

An ion beam intensity and emittance measuring system. A substrate supports conductive zones or regions that are impacted by an ion beam. Periodically the conductive regions are discharged through an integrator circuit which produces an output corresponding to the charge buildup on the conductive region. By determining the charge for multiple such regions impacted by an ion beam, a two-dimensional mapping of ion beam intensity vs. position is obtained on essentially a real-time basis. An emittance mask is also placed over the substrate and a measure of the emittance or spread of the ion beam is obtained.

15 Claims, 11 Drawing Sheets

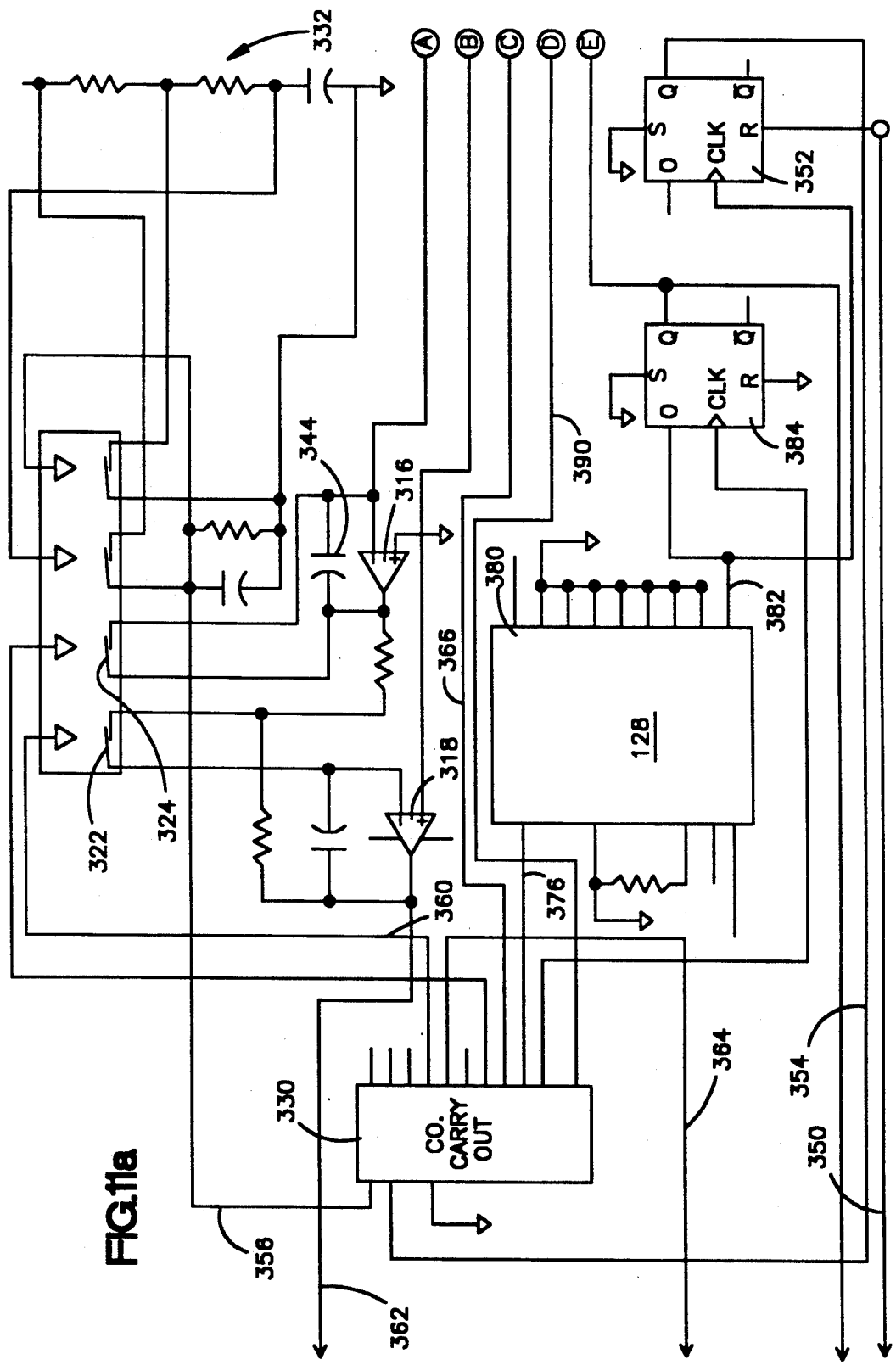

ION BEAM PROFILING METHOD AND APPARATUS

FIELD OF THE INVENTION

The present invention concerns an ion beam implant system, and more particularly concerns an ion beam profiling system for evaluating the intensity and emittance of an ion beam.

BACKGROUND ART

It is known to use an ion beam to dope silicon wafers with a controlled concentration of an impurity to produce a semi-conductor material. Ion implanters used for silicon wafer treatment typically include an ion source and beam forming structure which causes ions emitted from the source to form an ion beam that follows a travel path to an ion implantation chamber. Within the ion implantation chamber silicon wafers are impacted by the ion beam.

In certain classes of ion implanters, these silicon wafers remain stationary and the ion beam is scanned across the wafer surface. In an alternate design, the wafers are caused to move through the ion beam. These latter systems include ion beams having a relatively large diameter, often as large as the diameter of the wafer that the ion beam impacts. A wafer support rotates wafers arranged in a circular array through the ion beam at controlled rates until proper dopant levels are reached.

Ion beam intensity is a measure of the number of particles per unit time at a given location of the ion beam cross section. The ion beam emittance is a measure of the angular spread of the beam at that location.

It is desirable to know the ion beam intensity and ion beam emittance across the extent of the ion beam. If doping problems occur, the intensity and emittance profile of the beam can be used for diagnosing those problems. Additionally, this information is useful when tuning the ion beam to assure consistency between successive wafer doping cycles.

It is desirable that ion beam profile information be readily available on an essentially "real time" basis so that technicians monitoring ion implanter performance can make adjustments based upon the ion beam profile. Rapid updating of beam profile information allows those adjustments to be made and the effect the adjustments have on beam profile studied and re-evaluated.

DISCLOSURE OF THE INVENTION

Apparatus constructed in accordance with the present invention provides a beam profiling capability for monitoring beam intensity. The apparatus includes an insulating substrate that positions multiple, spaced charge-collecting zones within an intercept region of an ion beam. The spaced charge-collecting zones are generally referred to in the ion implantation art as Faraday cups. The spaced charge-collecting zones used in the present invention are preferably formed by applying a conductive material to the insulating substrate.

The spaced charge collecting zones are coupled to circuitry for periodically measuring the charge build-up on the spaced charge-collecting zones and determining an ion beam profile from the measured charge. The preferred design includes a multiplexer for coupling multiple charge-collecting zones to a common output and a circuit for generating intensity signals from the charge-collecting zones to define an ion beam intensity mapping.

Each charge-collecting zone acts as a capacitor for storing charge as ions bombard the charge-collecting zone. The multiplexer couples the charge on each such zone to an integrator circuit which provides an output voltage proportional to the charge on the charge-collecting zone independent of the capacitance of the charge-collecting zone.

Different geometries for the charge-collecting zones are disclosed. These different geometries include linear arrays of such zones, as well as concentric rings. Additionally, the apparatus constructed in accordance with the invention may include masking devices for intercepting portions of the ion beam and selectively allowing other portions to impinge upon the charge-collecting zones.

Intensity monitoring apparatus includes a memory for storing data received from the collecting zones, and additionally includes a display for presenting a visual display of beam intensity and/or emittance on a viewing screen. It is advantageous for the beam profile information to be updated rapidly to allow beam setup and diagnostics to take place in real time. Rapid data collection and transfer techniques are used which result in visual mapping updates at one-second intervals.

BRIEF DESCRIPTION OF THE DRAWINGS

FIGS. 11a and 11b are detailed schematics of a circuit that monitors a charge build-up on 128 individual charge-collecting zones;

BEST MODE FOR PRACTICING THE INVENTION

Figure 1:
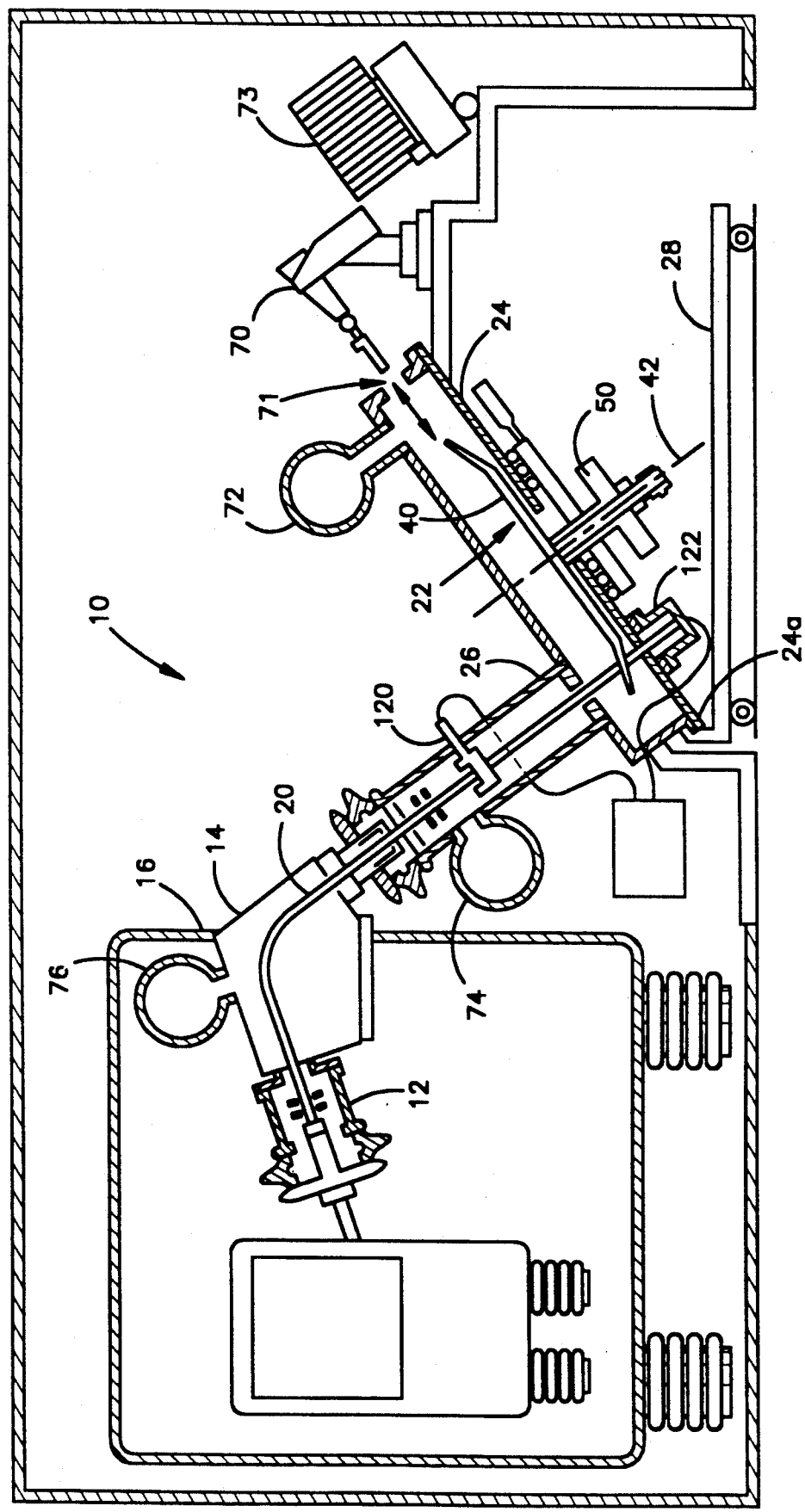
FIG. 1 is a schematic overview of an ion implantation system for treating workpieces by means of ion bombardment of the workpieces.

Turning now to the drawings, FIG. 1 depicts an ion beam implantation system 10 for treating workpieces such as thin silicon wafers, which after treatment become semi-conductors. The ion implantation system 10 includes an ion source 12 and a beam analyzing magnet 14 contained within a high-voltage housing 16. An ion beam 20 exits the source 12 and is bent by the analyzing magnet 14 to follow a travel path that exits the high-voltage housing 16 and enters an ion implantation chamber 22 defined by a second housing 24. The analyzing magnet 14 causes only those ions having an appropriate mass to follow a travel path which enters the housing 24.

The ion implantation chamber 22 is supported on a movable pedestal 28 that allows the chamber 22 to be aligned relative to the ion beam 20. The ion beam 20 impinges upon a wafer support 40 mounted for rotation about an axis 42. The wafer support 40 supports multiple silicon wafers that move along a circular path so that the ion beam 20 impacts each of the wafers and selectively dopes those wafers within ion impurities to form a semi-conductor. High-speed rotation of the support 40 is provided by a motor 50 having an output shaft coupled to the support 40.

Additional details concerning an ion implantation system of the type described herein are contained in U.S. Pat. No. 4,672,210 to Armstrong et al. The subject matter of this prior art patent is incorporated in the present patent application by reference.

Silicon wafers are inserted into the ion implantation chamber 22 by a robotic arm 70 located outside the chamber 22. The wafers are inserted through a vacuum port 71 that allows a vacuum to be maintained within the chamber 22 and along the beam path from the source 12. Three pumps 72, 74, 76 are schematically positioned along the FIG. 1 depiction of the ion beam path and maintain the ion beam path from the source 12 to the implantation chamber 22 at a controlled pressure.

The robotic arm 70 obtains wafers to be treated from a cassette 73 that stores the wafers. Once the wafers have been doped by the ion beam 20 with a controlled concentration of dopant, the wafers are withdrawn from the chamber 22 and returned to the cassette 73. Automatic mechanisms for transferring wafers to and from the cassette are known in the prior art.

Stationed along the ion beam travel path are components for shaping the ion beam, eliminating unwanted ion species from the ion beam, and monitoring the ion beam profile. A beam potential sensor may be used to monitor beam potential and a beam neutralizer may be used for injecting ion neutralizing electrons into the beam just before the beam enters the chamber 22.

ION BEAM INTENSITY MONITORING

The ion beam profile is monitored by two beam profiling devices 120, 122. A first profiling device 120 is mounted to a sidewall 26 of the implanter along the ion beam travel path and is selectively moved in and out of the beam path to intercept the ion beam 20. A second profiling device 122 is connected to a side wall 14a of the magnet. The magnet 14 is de-activated during analysis so that the ion beam 20 is not bent and strikes the profiling device 122. A third profiling device 123 is attached to a rear wall 22a of the chamber 22. The wafer support 40 moves sideways during analysis to allow the ion beam to strike the device 123.

Figure 2:
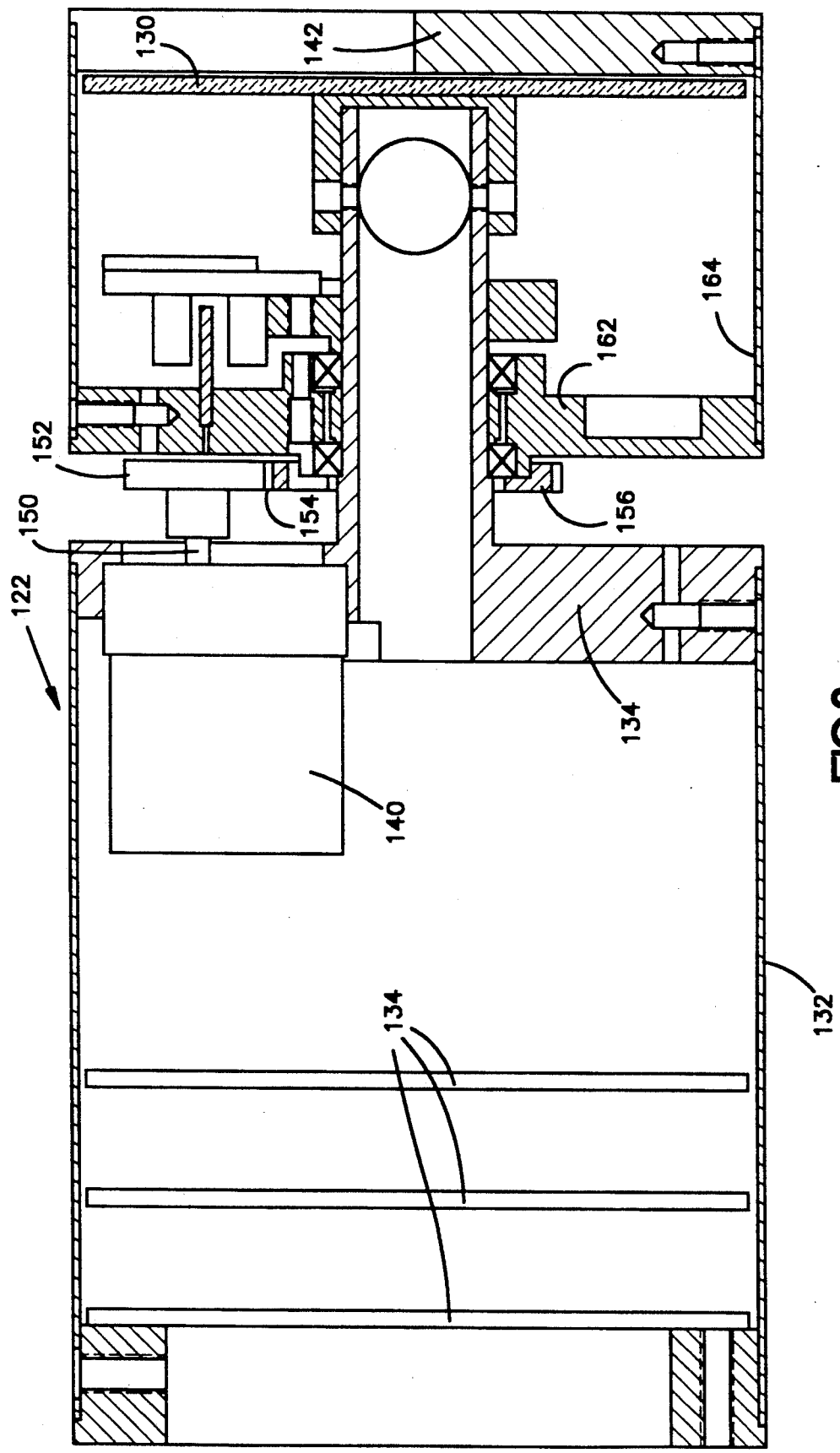
FIG. 2 is a section view showing an ion beam profiler suitable for monitoring intensity and emittance of an ion beam.
Figure 6:
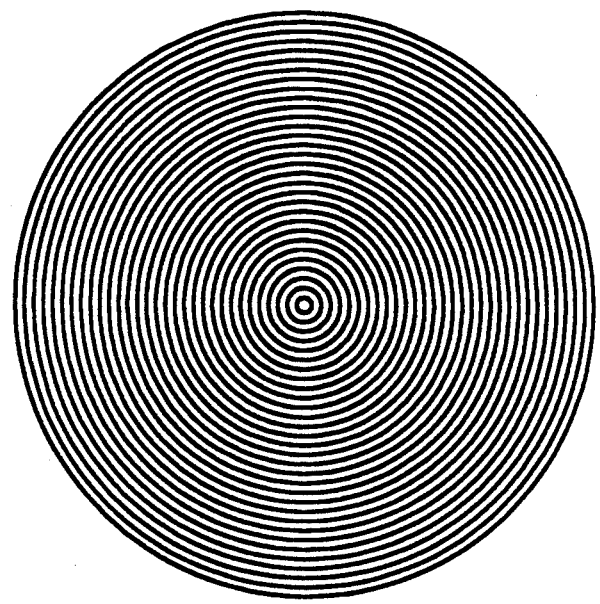
FIG. 6 is a plan view of an insulating substrate that supports a plurality of concentric charge-collecting zones for monitoring ion beam intensity and emittance.

FIG. 2 is a section view of the profiling device 122. A stationary insulating substrate 130 in the form of a circular disk supports a number of concentric metal charge-collecting rings (FIG. 6) that intercept ions. Since the rings are on an insulating substrate and are electrically isolated from each other, the charge they collect is proportional to the ion beam intensity striking the ring. A generally cylindrical housing 132 is mounted to the side wall 14a of the magnet 14. In addition to supporting the substrate 130, the housing 132 supports three circuit boards 134 that include data gathering circuitry for monitoring ion beam intensity by determining charge build-up on charge-collecting rings of the substrate 130.

Figure 3:
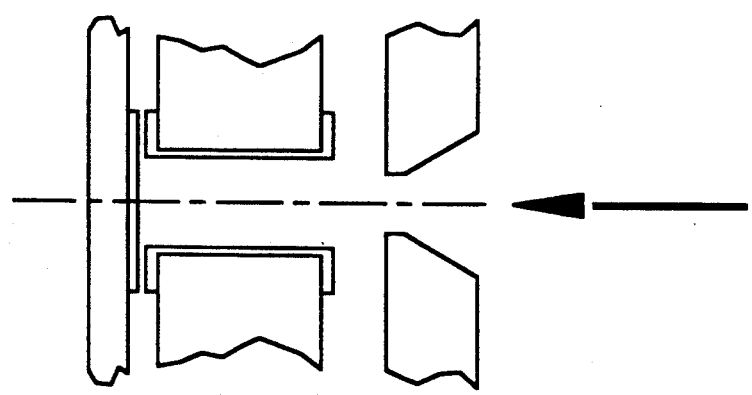
FIG. 3 is an enlarged section view showing a single charge-collecting zone of a plurality of such zones supported by an insulating substrate.

FIG. 3 shows a section view of the substrate 130 passing through one of the rings R. Spaced from the substrate 130 is another insulating substrate 131 having slots to allow ions to pass through the insulator 131 and strike the ring R. Metal walls 133 plated to the insulator 131 form a Faraday cup structure similar to the traditional prior art Faraday cup arrangement. These walls 133 are electrically connected to the ring R. In accordance with a preferred embodiment of the present invention, the insulator 131 and conductor 133 are not used and instead only an array of conductive regions are applied to the substrate 130.

Figure 4:
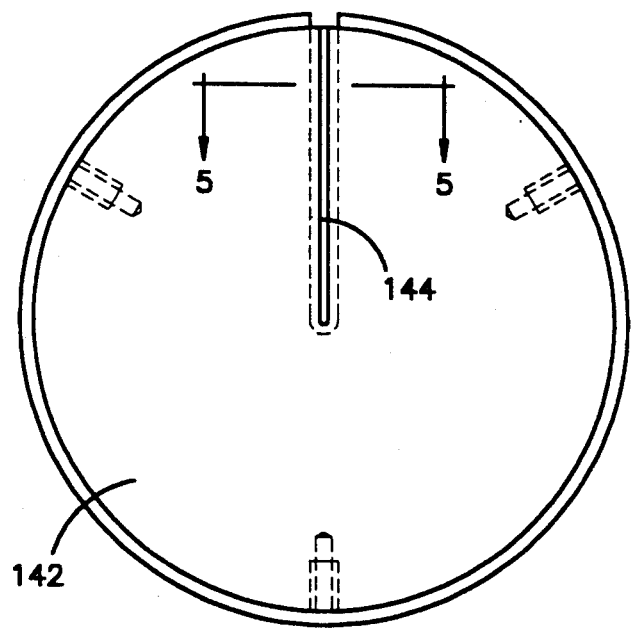
FIG. 4 is a plan view of a mask placed in front of the plurality of charge-detecting zones for selectively masking off portions of the ion beam and concentrating ion beam impingement into a selected region of the collecting zones.
Figure 5:
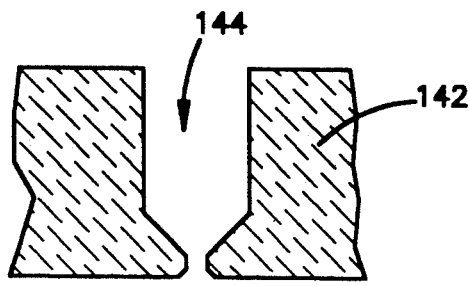
FIG. 5 is a section view taken along the line 5—5 in FIG. 4.

The housing 132 has an end wall 134 which supports a stepper motor 140 that rotates a graphite mask 142 at a controlled rate in front of the substrate 130 to allow selective regions of the ion beam to impact the rings on the substrate. As seen most clearly in FIG. 4, the graphite mask 142 is generally circular in plan and intercepts all but a narrow zone of the ion beams reaching the profiling device 122. An elongated slot 144 extends from an outer periphery of the mask 142 inward to a center and selectively allows ions within the ion beam 20 to impact the insulating substrate 130. By coordinating rotation of the mask 142 with intensity data obtained from the data gathering circuitry, a mapping of ion beam intensity is obtained. As seen most clearly in FIG. 5, the mask 142 includes a necked down region 143 at a base of the slot 144 to define the narrow zone of ion beam impingement on the substrate 130.

As seen most clearly in FIG. 2, the insulating substrate 130 is fixed to an elongated tube 146 extending perpendicularly from the end wall 134 of the cylindrical housing 132. An output shaft 150 from the stepper motor 140 extends beyond the end wall 134 and is coupled to a drive gear 152. A drive belt 154 is coupled to the drive gear 152 and drives a driven gear 156.

Two bearings 160 support an annular plate 162 and the driven gear 156 for rotation with respect to the elongated tube 146. Attached to the annular plate 162 is a tube 164 that supports the graphite mask 142. Controlled energization of the stepper motor 140 transmits rotational motion to the gear 152 causing the driven gear 156, annular plate 162, and tube 164 to transmit rotational motion to the graphite mask 142. Controlled energization of the stepper motor thereby causes the elongated slot 144 to rotate about a center axis of the ion beam.

As noted above, the substrate 130 defines patterns of annular rings for collecting charge as the ion beam impinges upon the substrate. Since the conductive rings are isolated from each other, it is possible to selectively discharge these regions while causing the graphite mask 142 to rotate through the ion beam, allowing an intensity mapping of the ion beam to be obtained. By way of example, if each of the concentric rings is discharged 128 times for each rotation of the graphite mask 142, an array of 128 equally spaced intensity readings are obtained from the conductive rings.

An optical encoder 170 provides an indication to the data gathering circuitry 136 of the orientation of the mask 142. The encoder 170 monitors rotation of a ring 172 connected to the annular plate 162. As the stepper motor rotates the mask 142, the ring 172 also rotates and the encoder 170 monitors the orientation of the ring 172.

Figure 7:
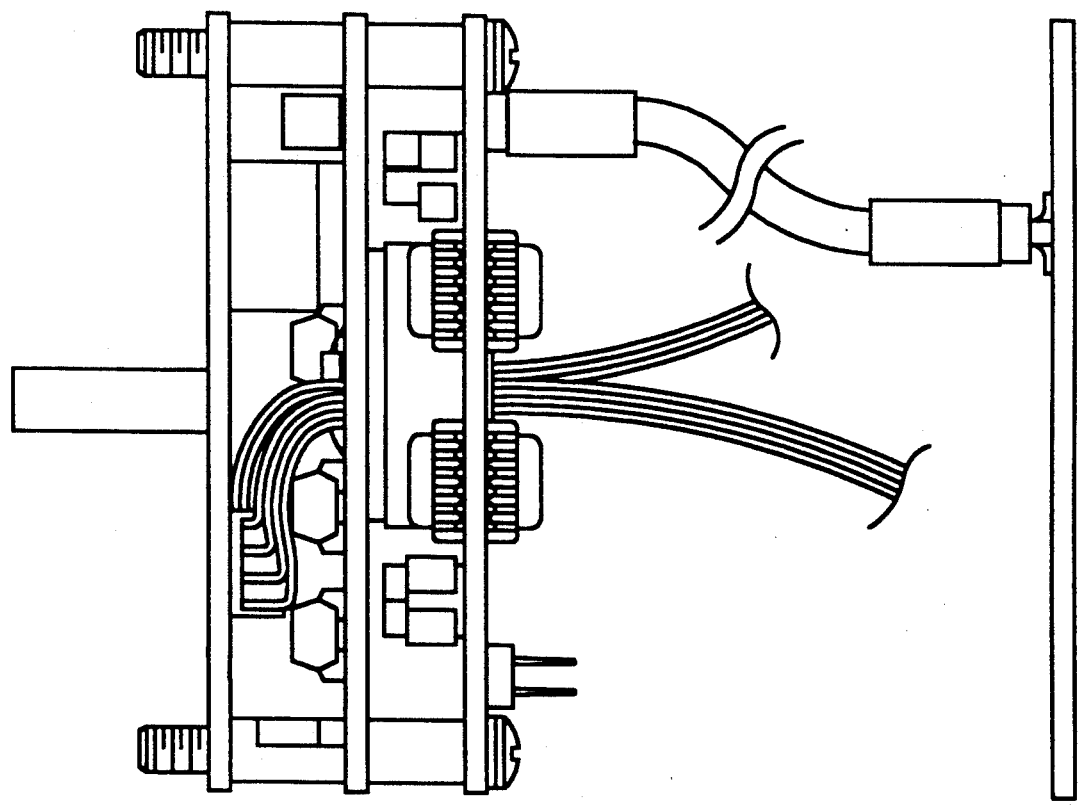
FIG. 7 is an elevation view showing a circuit subassembly for monitoring the output of the charge-collecting zones in FIG. 6.

FIG. 7 illustrates a removable electronic subassembly 180 including the circuit boards 134 that are mounted within the housing 132. A multi-conductor cable 182 electrically connects the multiple conductive rings carried by the substrate 130 to the data gathering circuitry. Ribbon cables 184, 186 couple energization and data signals to and from the stepper motor 140 and optical encoder 170.

64-CHANNEL SAMPLING CIRCUIT

Figure 10:
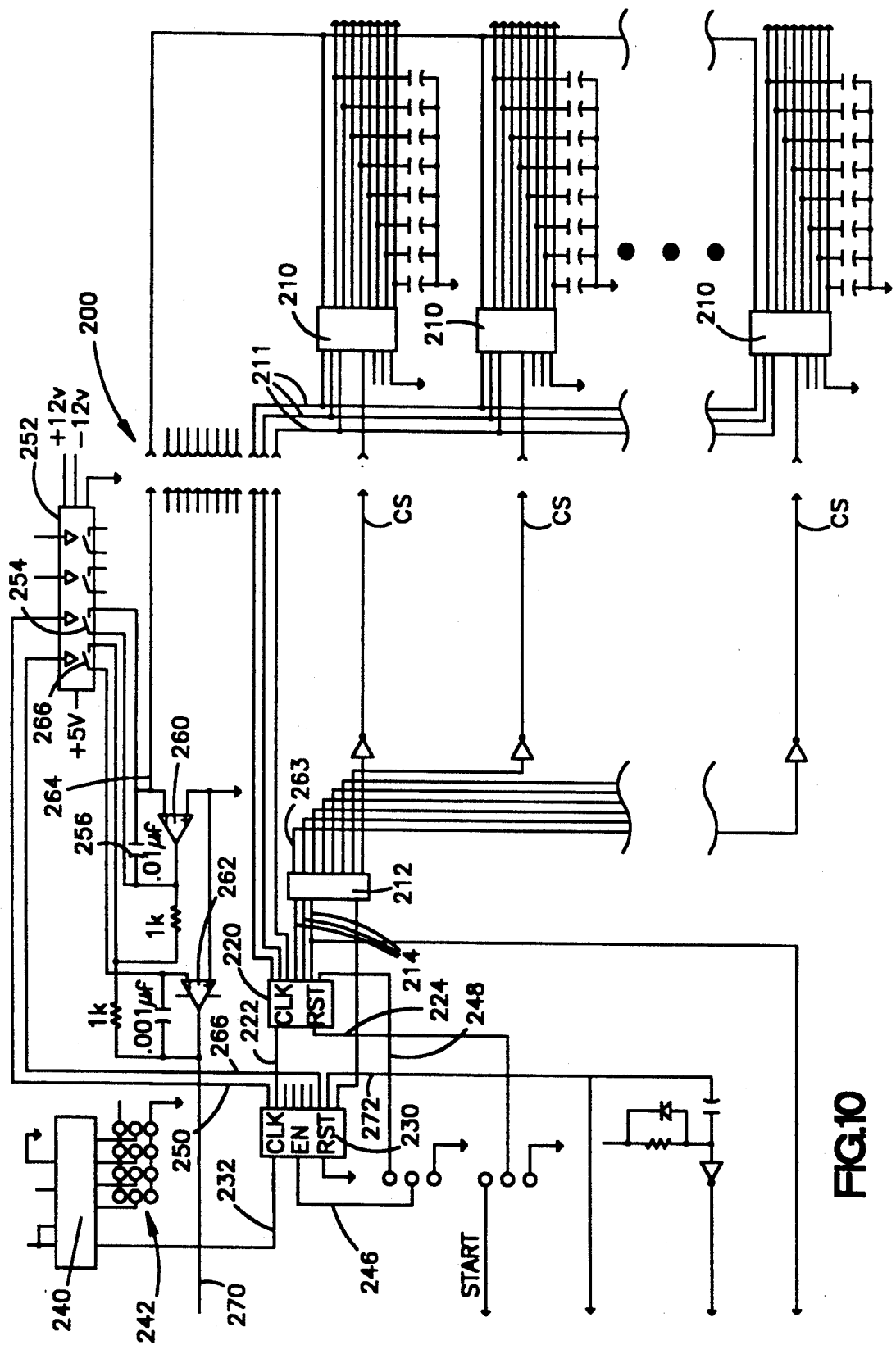
FIG. 10 is a detailed schematic of a circuit for monitoring the charge build-up on 64 individual charge-collecting zones.

FIG. 10 illustrates a circuit 200 suitable for acquiring ion beam intensity data from the charge that builds up on equally spaced conductive rings due to ion bombardment. The circuit 200 includes a plurality of multiplexer circuits 210 each having eight inputs and a single output. Each input is connected to one of the conductive rings on the substrate 130. Each conductive ring of the FIG. 6 array acts as a capacitor since charge from the ion beam 20 builds up on the ring as the ions contact the ring. A connection through each multiplexer circuit 210 is determined by the address presented on three address lines 211 and a chip select line CS connected to a 3 to 8 decoder circuit 212. The decoder circuit 212 renders one and only one of its eight chip select outputs high in response to receipt of an enable input 213. A three-bit input 214 determines which of the eight chip select outputs goes high.

The input 214 is controlled by a digital counter 220 having a clock input 222 and reset input 224. The clock input 222 to the counter 220 is in turn coupled to one output of an eight-state counter circuit 230. A clock input 232 to this second counter circuit 230 is coupled to a programmable clock 240 having an output frequency that is adjustable and preferably set at approximately 50 kilohertz. The frequency of the clock 240 is determined by a number of jumper connections 242 coupled to the clock 240 which are user selectable to change the output frequency.

The counter circuit 230 cycles through eight different phases as each of the eight outputs is successively clocked high. A reset input 244 to the counter 230 is grounded so that the counter repeatedly cycles through its eight stages. The counter 230 includes an enable input 246 which goes high to suspend clocking of the counter. As seen in FIG. 10, a most significant bit 248 from the counter 220 is coupled to the enable input 246 of the counter 230.

The circuit 200 gathers intensity data under control of an external computer having an interface for acquiring the intensity data and for sending output controls to the circuit 200. The acquiring of data begins with the receipt of a start pulse from the computer at the reset input 224 of the counter 200. This reset input 224 clears the counter 220 and in particular, clears the enable input 246 to the counter 230. This allows the counter 230 to cycle through its eight phases in response to receipt of clock pulses from the clock 240. One output 250 from the counter 230 is coupled to an analog switch 252 having a contact 254 that is closed when the output 250 goes high. When the switch contact 254 closes, a feedback capacitor 256 connected to an operational amplifier 260 is discharged. The operational amplifier is configured as an integrating amplifier so that each time the contact 254 closes, an output 261 of this amplifier is reset to zero volts.

A second output 222 from the counter 230 is coupled to the clock input of the second counter 220. When this bit goes high, the analog switch contact 254 opens and the clock 220 increments its count. When the reset input 224 was actuated, the address signals 211 were set to all zero as were the three inputs 214 to the 3 to 8 activate the multiplex circuit 210 to which it is coupled. Additionally, the address inputs 211 to the active multiplexer designate one of eight conductive rings on the insulating substrate 130 to connect through the selected multiplexer as an input 264 to the operational amplifier 260.

The selected conductive ring is discharged during the next two cycles of the clock 240 since the enable input 213 to the decoder 212 is high. The capacitor 256 charges as a selected ring discharges so that the output of the operational amplifier 260 is a signal proportional to the charge and, therefore, beam intensity at the location of the discharged ring.

The disclosed charge measuring technique is independent of the capacitance of the ring. This is important since it allows thick-film capacitors to be built into the printed circuit boards.

An output 266 from the clock 230 is connected to a contact 268 of the switch 252. When the output 266 goes high, the contact 268 closes and the output 261 from the operational amplifier 260 is connected through this contact 268 to an inverting input (−) of the operational amplifier 262. An analog signal at an output 270 of the operational amplifier 262 is coupled to an A/D converter interface of the computer to present a signal to the computer. The A/D converter converts the analog output and converts it to a digital signal related to the ion beam intensity of the discharged ring.

Receipt of a next subsequent clock pulse at the input 232 causes an output 272 form the counter 220 to go high. This output is connected to an analog to digital (A/D) convertor and provides a signal that the analog data presented at the output 270 should be acquired by the A/D converter and then stored in the computer.

As the counter 220 cycles through its output states, first the address inputs 211 cycle through 0–7 so that the eight conductive rings coupled to a particular one of the multiplexer circuits are discharged and then the 3 to 8 decoder selects a different multiplexer circuit by activating a different chip select signal. The total number of regions from which data can be acquired is 8 multiplexer inputs × 8 multiplexers = 64 sampling regions. A most significant bit of the address inputs 214 to the decoder 212 also serves as a synchronization output (SYNC) for use with an oscilloscope used in displaying intensity data. When an output 248 from the counter 220 goes high in response to receipt of a clock input signal 222, the clock 230 is inhibited and gathering of data is suspended until a next START signal 224 is received from the computer interface (not shown).

Outputs from the operational amplifier 262 are transmitted at the output 270 to an analog to digital convertor at the computer interface and stored for subsequent evaluation. In accordance with a preferred data gathering technique, the interface loads data into the computer memory using direct memory access techniques known in the prior art.

Figure 14:
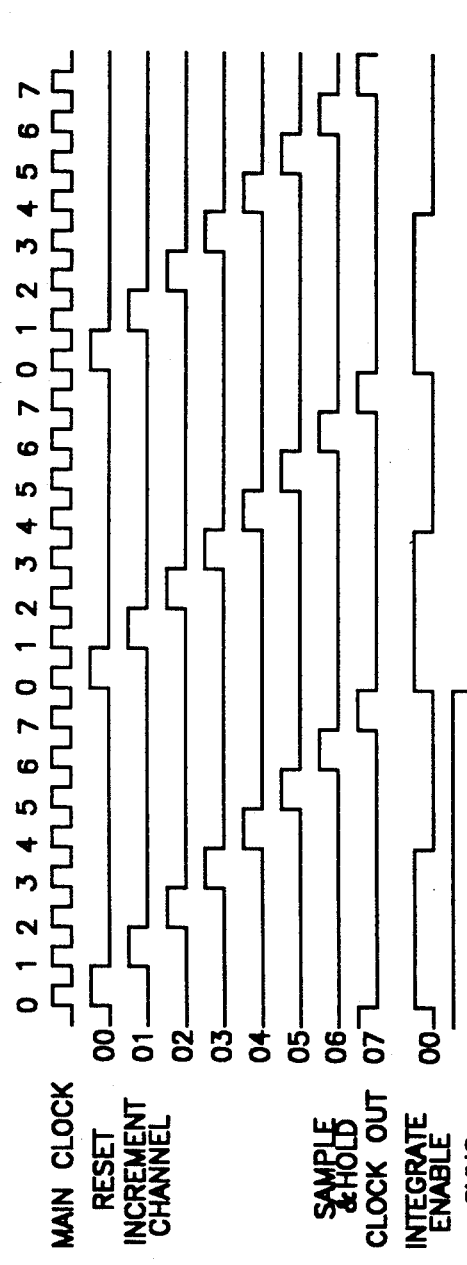
FIGS. 14 and 15 are timing diagrams showing digital data signals for the FIGS. 10, 11a and 11b circuits.

FIG. 14 is a timing diagram showing a sequence of digital signals that control data gathering. The main clock signal 232 causes the eight outputs 00-07 from the counter 230 to go high for one clock pulse.

128-CHANNEL SAMPLING CIRCUIT

Figure 11B:
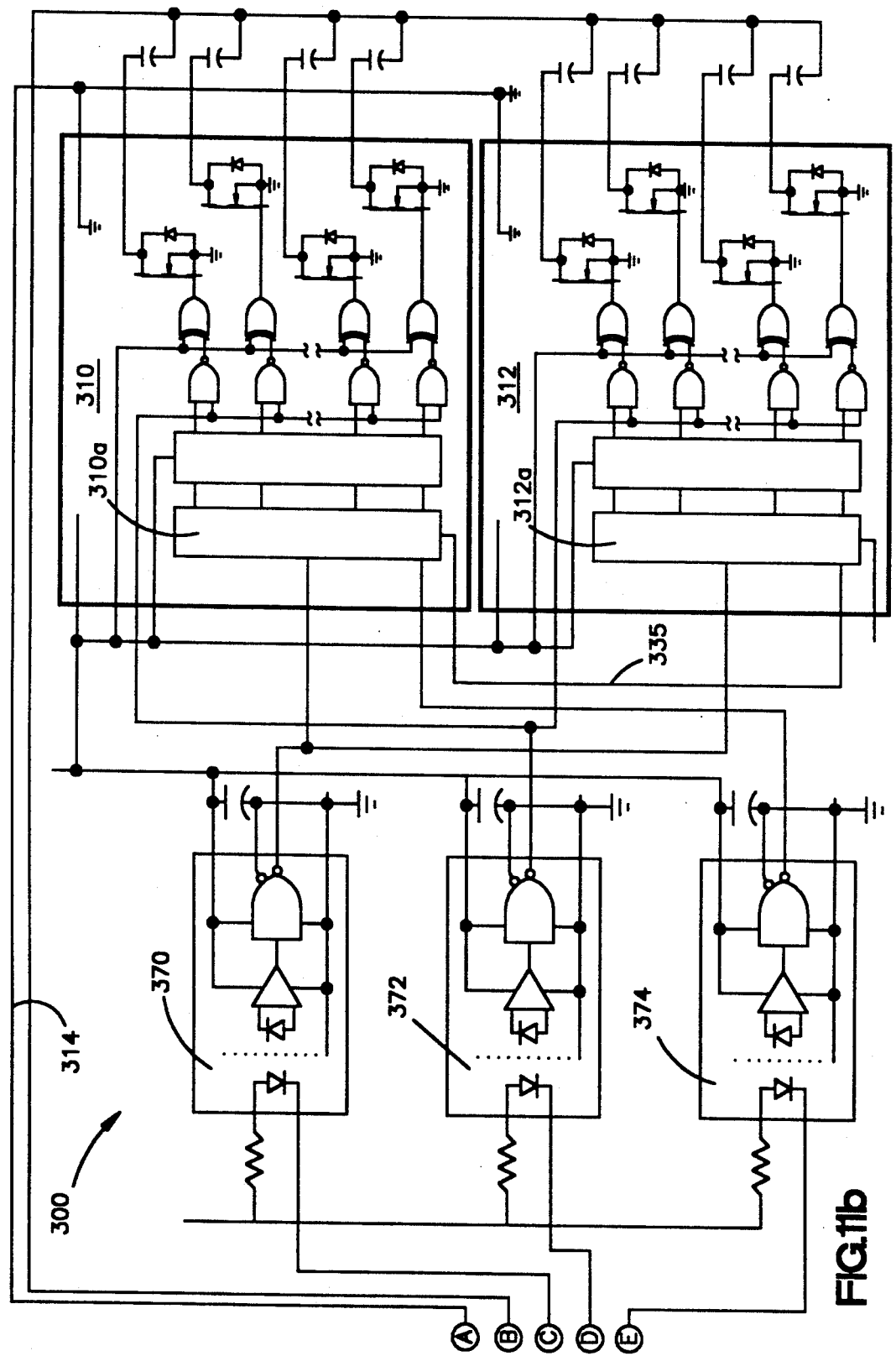

An alternate and presently preferred circuit 300 for gathering data is depicted in FIGS. 11a and 11b. In these figures, a plurality of charge gathering rings or regions are again depicted as capacitors 302 (FIG. 11b). The capacitors 302 are coupled as inputs to two integrated circuits 310, 312 having their ground connections GND coupled together as an input 314 to an operational amplifier 316. The operational amplifiers 316, 318 are configured in exactly the same manner as the operational amplifiers 260, 262 of FIG. 10. The circuit 300 also includes an analog switch 320 having two control inputs for closing contacts 322, 324 within the analog switch 320. These control inputs are coupled to selected outputs of a counter circuit 330. The counter circuit 330 has a clock input CLK connected to a 500 kilohertz oscillator 332.

The integrated circuits 310, 312 are 64-channel serial to parallel converter circuits having 64-bit static shift registers 310a, 312a. An output 335 of one shift register 310a is connected as a data input to the second shift register 312a. The two circuits 310, 312 also include latch and drive circuits for activating arrays of field effect transistors (FETS) 340, 342. When a selected one of the FETS is turned on by its associated drive circuit, the charge-collecting region to which the FET is connected discharges through the FET through the ground connection GND and charges an integrating capacitor 344 coupled to the operational amplifier 316.

Data acquisition is initiated by receipt of a start pulse 350 from a computer interface that retrieves data from the circuit 300. This resets an RS flip-flop 352 causing a Q output 354 to be reset to 0. The output 354 is coupled to an enable input of the counter 330 causing the counter 330 to begin cycling through its outputs in response to a clock signal at a clock input 356. As seen by reference to the timing diagram of FIG. 15, operation of the counter 330 is similar to the counter 230 of FIG. 10. Each clock pulse causes a different one of ten outputs to go high. When an output 360 goes high the analog switch contact 322 closes and the output of the operational amplifier 316 is coupled to the inverting input of the operational amplifier 318 causing a signal corresponding to the charge on a conductive region to be presented as an output 362 from the circuit 300.

A next subsequent counter output 364 is used as a synchronizing signal by the computer monitoring the analog output 362. When the output 364 goes high the analog output 362 is converted by an A/D converter (not shown) to a digital value and stored. A counter output 366 is coupled to one of three opto-isolating circuits 370, 372, 374. When the output 366 disrupts current through a diode 370a of the opto-isolating circuit 370, a clock input to the two circuits 310, 312 is pulsed high causing the data within the shift registers 310a, 312a to shift one position. Initially, all contents of the shift registers are empty so that receipt of the clock input shifts all zeros in the shift registers 310a, 312a.

A next output 376 from the counter 330 clocks a divider circuit 380. The divider circuit 380 counts clock pulses and upon receipt of a 128th pulse, a carry-out output 382 goes high, activating a clock input to the flip-flop 352. When this occurs, the Q output from the flip-flop changes state and de-activates the counter 330. The carry-out signal from the divider circuit 380 also is presented as a D input to a second flip-flop circuit 384. The Q output from the flip-flop 384 disrupts current through LED 374a of the opto-isolating circuit 374 causing a data input signal 385 to the shift register 310a to go high each time the divider circuit 380 receives 128 clock signals from the counter 330. A carry-out signal 390 from the clock 330 activates a third opto-isolating circuit 372. This circuit is coupled to a plurality of AND gates for transmitting drive signals to the FET transistors.

From the above, it is seen that for each time the counter 330 cycles through its outputs, a clock input CLK to the two circuit 310, 312 causes a high data bit input from the opto-isolating circuit 374 to be shifted to a next subsequent shift register position of the two circuits 310, 312. Later during the counter cycle, the contents of the shift registers are output to an associated FET causing one of the one hundred twenty eight FETs to discharge an associated region of the substrate. During the next cycle, when the output 360 of the counter 330 goes high, an output from the discharged region is coupled through the operational amplifiers 316, 318 to the circuit output 362.

Figure 15:
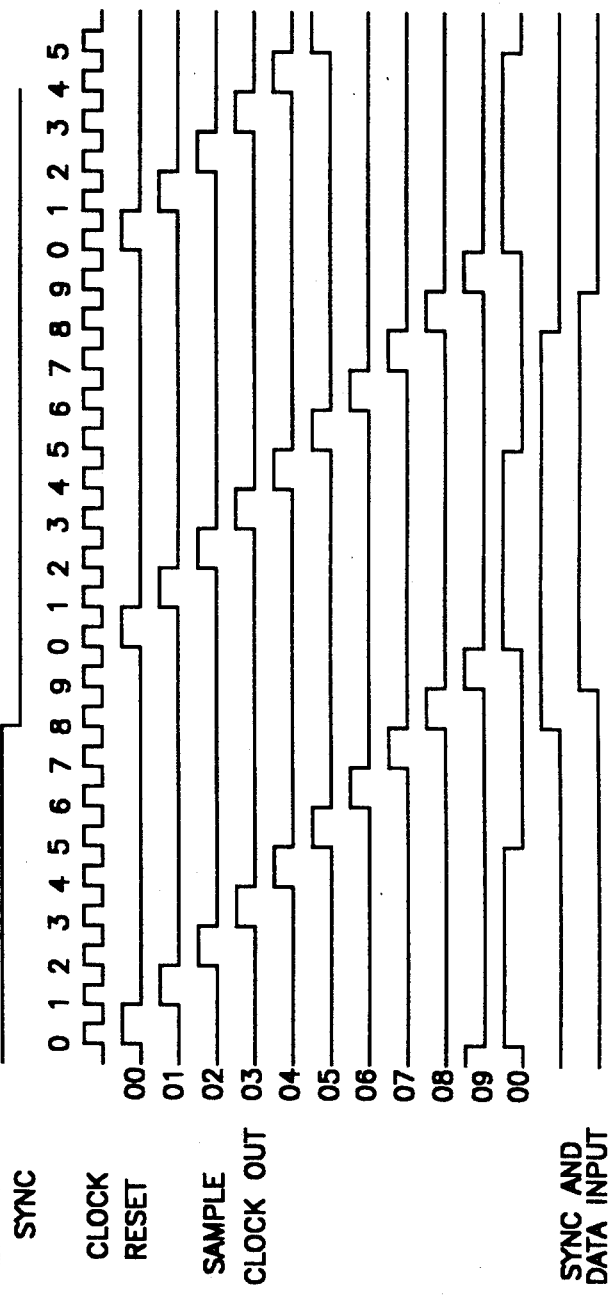

FIGS. 14 and 15 are timing diagrams showing various interconnection points of the two circuits 200, 230. The FIG. 14 depiction corresponds to the 64-channel data acquisition circuit 200 of FIG. 10, and the timing diagram of FIG. 15 corresponds to the 128-channel data acquisition circuit 300 of FIG. 11. Through coordinated activation of the start pulse and controlled stepper motor actuated rotation of the graphite mask, the computer gathers intensity data and present a visual mapping of that data.

Figure 12A:
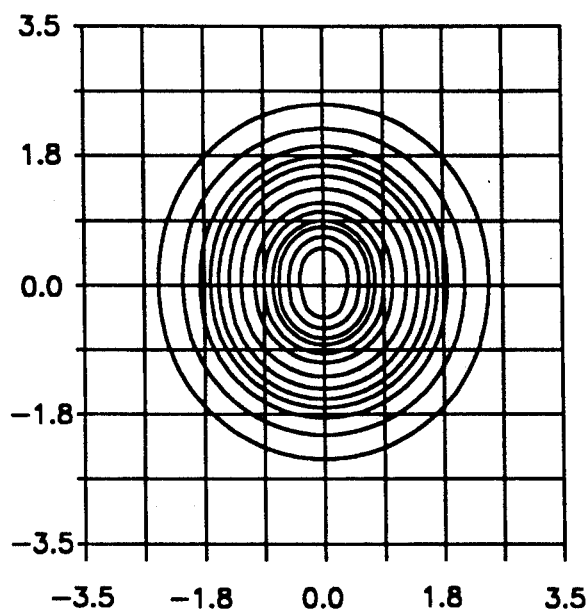
FIGS. 12a, 12b, 13a, 13b and 13c depict visual displays of beam intensity and emittance based on data collected from multiple charge-collecting zones.
Figure 12B:
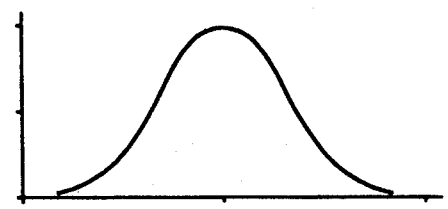

Representative data obtained using the 128-channel data acquisition circuit 300 is depicted in FIGS. 12a and 12b. This data is presented on a visual display system 392 having a color graphics CRT and computer including an analog to digital interface for acquiring and manipulating the intensity data. The ordinate and abscissa of FIG. 12a are in centimeters. The generally circular rings are lines of equal ion beam intensity. The outermost ring depicts a region of the ion beam having an average beam intensity of 0.04 millirads per square centimeter. The centermost ring has an average beam intensity of 0.60 millirads per square centimeter. The FIG. 12b depiction shows the variation of beam intensity from peak at the center of the ion beam to a diminishing intensity at locations spaced from the center. The FIG. 12a and 12b depictions are used during ion beam set-up and calibration.

EMITTANCE

Figure 8:
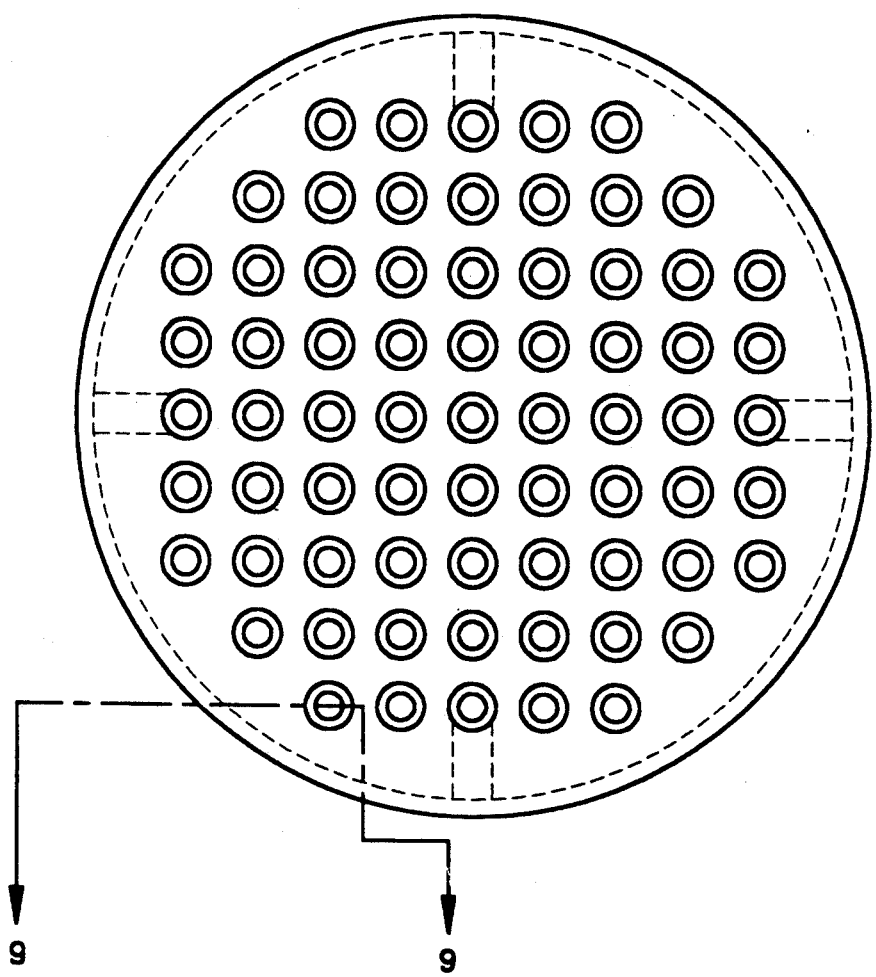
FIG. 8 is a plan view of a mask having an array of apertures to selectively mask ion beam impingement upon the charge-collecting zones.
Figure 9:
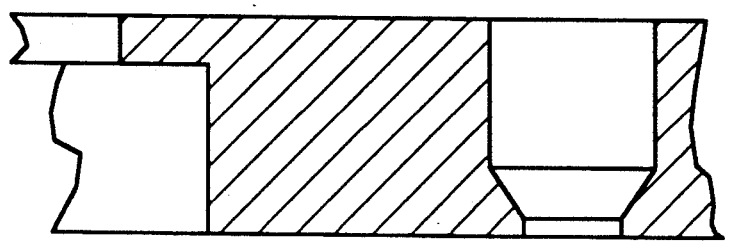
FIG. 9 is a view as seen from along the plane defined by the line 9—9 in FIG. 8.

An additional graphite mask 400 (FIG. 8) can be placed ahead of the insulating substrate. The mask 400 include a plurality of apertures 410 in a well-defined arrangement on the mask 400. The location of the center of each aperture is stored in a data look-up table within a monitoring computer. As the intensity data is obtained from the circuit 300, the image of the beam through the emittance mask 400 is compared with the position and size of the holes in the emittance mask.

Figure 13A:
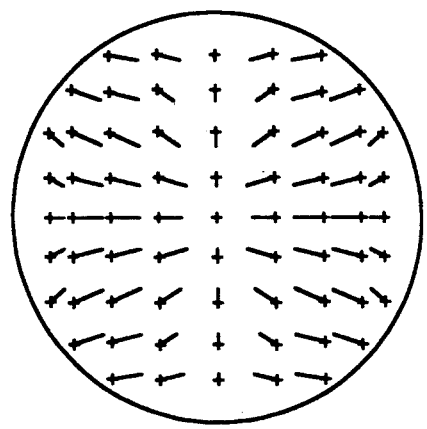
Figure 13B:
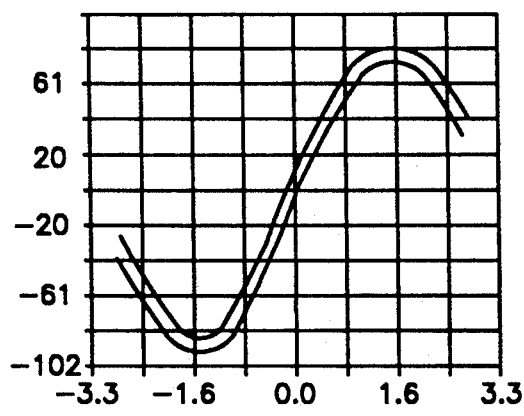
Figure 13C:
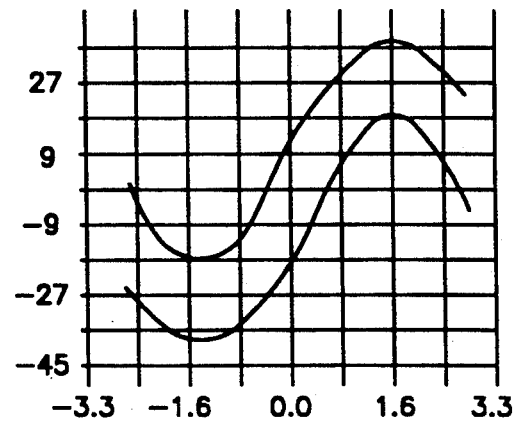

FIGS. 13a–13c shows the angular spread of the beam. The arrows in FIG. 13a show the x and y spread from a normal beam that enters the chamber 22 at a 90 degree angle. FIGS. 13b and 13c depict numerically what FIG. 13a depicts vectorially. The ordinate in these figures is beam intensity and the space between the two lines indicates the vector component of beam spread perpendicular to the x (FIG. 13b) and y (FIG. 13c) directions. This emittance information is used in beam calibration and set-up to maximize doping yields during ion implantation.

MOVEABLE LINEAR ARRAY

Figure 16:
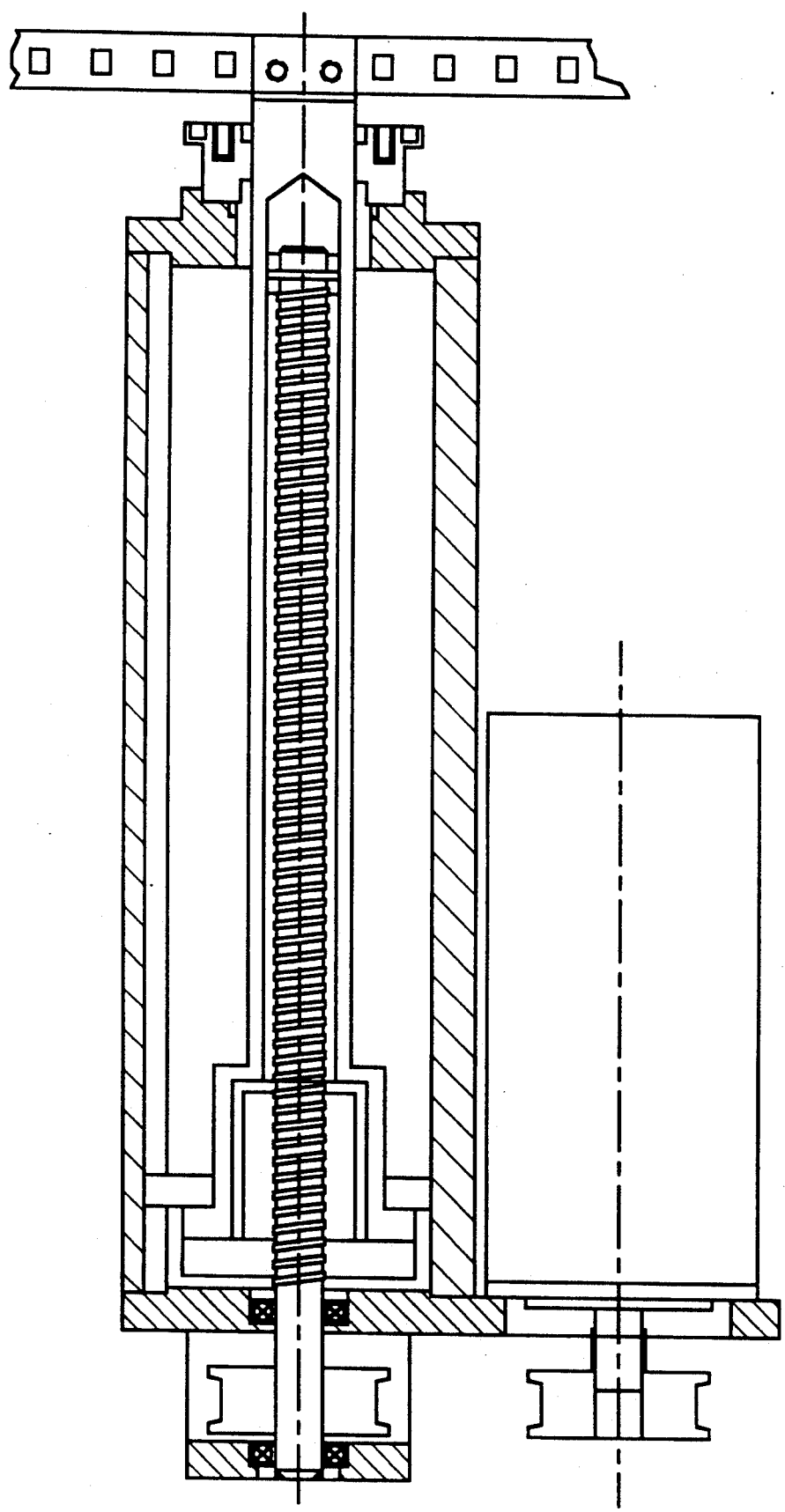
FIG. 16 is a partially sectioned view of a motor drive system for a linear array of charge-collecting regions supported on a planar substrate.

In an alternate embodiment of the present invention, the circuits 200, 300 are coupled to a linear array of conductive regions supported on an insulating substrate. The linear ray is then mechanically moved back and forth through the ion beam to obtain a two-dimensional intensity mapping. Such an arrangement would be more suitable for use in a beam profiling device 120 that can be selectively inserted into the beam path for intensity and emittance monitoring. Such an arrangement would not incorporate a moveable mask but would instead include a linear drive 420 such as that depicted in FIG. 16. The drive 420 includes a stepper motor 422 having an output shaft 424 coupled to a pulley 426. A belt 428 is reeved over the pulley 426 and a drive pulley 430 pinned to a shaft 432. The shaft 432 is supported for rotation within bearings 434 carried by a housing 436. A drive member 440 supported within the housing is driven in and out of the housing by a transmission coupled to the bearing supported shaft. As the transmission rotates with respect to the housing, the drive 440 moves in and out of the housing in a controlled manner.

An elongated insulating substrate 450 having spaced conductive pads or regions 452 is coupled to the drive member 440 for translation through the ion beam 20. In accordance with the preferred embodiment, the path of travel of the drive 440 is approximately six inches and is adequate to move the linear-insulating substrate 450 and conductive regions 452 move in and out of the beam path and selectively sample beam intensity. Either of the circuits 200, 300 can be used to sample data from the moving linear array of conductive regions and transmit that data to a computer for evaluation and visual display.

In the above embodiments of the invention, the substrate 130 is attached by cabling to the data capture circuit. Alternately, a fixed pattern of conductive regions is attached to one side of a substrate and the multiplexing integrated circuits are attached to an opposite side of the same insulating substrate. This arrangement enhances the beam monitoring resolution. As an example, if a 64-channel multiplexing integrated circuit is positioned on one side of the substrate, 64 collecting zones in an 8×8 array can be located on the opposite side in the position occupied by the integrated circuit. For a one inch×one circuit this corresponds to a resolution of ⅛ inch per charge-collecting zone. The device is fixed in the ion beam and occupies little space since there is no need for motion control electronics. Furthermore, this device is fast since the entire image is acquired by direct memory access. The device 123 coupled to the chamber 22 uses such a configuration due to space constraints in the vicinity of the chamber.

The present invention has been described with a degree of particularity. It is the intent, however, that the invention include all modifications and alterations from the disclosed design falling within the spirit or scope of the appended claims.

We claim:

1. Ion beam implantation apparatus for monitoring ion beam intensity distributions across an ion beam comprising:
   a) an insulating substrate that supports a plurality of charge-collecting zones wherein each charge-collecting zone is defined by a conductive material coupled to the insulating substrate;
   b) scanning means for causing different intercept regions of an ion implantation beam to impact the plurality of charge-collecting zones; and
   c) circuit means for periodically determining the charge build-up on the charge-collecting zones due to ion bombardment of said charge-collecting zones by discharging the charge-collecting zones; said circuit means including interconnecting means for coupling a plurality of charge-collecting zones to a common circuit output, a charge-determining circuit coupled to the common circuit output of said interconnecting means; and storage circuitry for storing signals from the plurality of charge-collecting zones to define an intensity mapping of the intercept region of the ion beam.

2. The apparatus of claim 1 wherein the charge-collecting zones comprise a plurality of spaced concentric conductive rings and wherein the scanning means comprises a shield having a radial slot there-through mounted for rotation about a central location of said conductive rings to allow circumferentially varying portions of the ion beam to pass through the radial slot and impact the spaced concentric rings.

3. The apparatus of claim 1 wherein the insulating substrate comprises an elongated member supporting an aligned array of collecting zones and said scanning means comprises actuator means to move the elongated member and the aligned array of collecting zones through the ion beam.

4. The apparatus of claim 3 where the actuator means comprises means for moving the elongated member along a linear travel path.

5. The apparatus of claim 1 further comprising display means for presenting a visual depiction of the intensity mapping.

6. The apparatus of claim 1 further comprising an ion beam intercept mask having an array of apertures that allow the ion beam to impact the charge-collecting zones and wherein the circuit means further comprises table look-up means for comparing ion beam intensity data with an ion beam profile based upon a geometry of said array of apertures in the intercept mask.

7. The apparatus of claim 1 wherein the charge determining circuit comprises an integrating circuit having an input connected to the common circuit output and an integrating circuit output for presenting a voltage signal related to the charge on the charge-collecting zones.

8. Ion beam implantation apparatus for monitoring ion beam intensity distributions across an ion beam comprising:
   a) an insulating substrate supporting a two dimensional array of spaced apart concentric conductive rings within an intercept region of an ion beam wherein each concentric conductive ring is defined by a conductive material coupled to the insulating substrate to intercept ions in the ion beam; and b) multiplex means for coupling a plurality of said charge-collecting zones to a common circuit output;

c) a charge-determining circuit coupled to the common circuit output of said multiplex means for storing a charge from a charge-collecting zone and producing an output signal related to the charge on the charge-collecting zone;

d) control means coupled to the multiplex means and the charge determining circuit for periodically resetting the charge-collecting circuit, causing the multiplex means to connect a different charge-collecting zone to the charge-determining circuit, and causing the output signal from the charge-determining circuit to be stored; and e) a shield having a radial slot therethrough mounted for rotation about a central location of said ion beam to allow circumferentially varying portions of the ion beam to pass through the radial slot and impact the spaced concentric rings.

9. The apparatus of claim 8 wherein said apparatus further comprises actuator means to move the insulating substrate and the two dimensional array of spaced apart charge-collecting zones into and out of the ion beam.

10. The apparatus of claim 9 where the actuator means comprises means for moving the insulating substrate along a linear travel path.

11. The apparatus of claim 8 further comprising a buffer connected to the charge determining circuit for temporarily storing the output signal.

12. The apparatus of claim 11 further comprising an analog to digital convertor for converting the output signal to a digital representation of the charge on a charge-collecting zone.

13. Apparatus for monitoring ion beam intensity distributions across an ion beam comprising:

a) structure including an insulating substrate that positions a plurality of charge-collecting zones within an intercept region of an ion beam wherein the charge-collecting zones are defined by spaced concentric conductive rings coupled to the insulating substrate to intercept ions in the ion beam;

b) a shield having a radial slot therethrough mounted for rotation about a central location of the conductive rings to allow circumferentially varying portions of the ion beam to pass through the radial slot and impact the spaced concentric rings; and c) circuit means for periodically determining the charge build-up on the charge-collecting zones due to ion bombardment of said zones by discharging the charge-collecting zones; said circuit means including interconnecting means for coupling a plurality of charge-collecting zones to a common circuit output, a charge-determining circuit coupled to the common circuit output of said interconnecting means; and storage circuitry for storing signals from the plurality of charge-collecting zones to define an intensity mapping of the intercept region of the ion beam.

14. A method of monitoring ion beam intensity as a function of position within the ion beam comprising the steps of:

a) arranging an array of spaced charge-collecting conductive zones on an insulating substrate;

b) moving the substrate through an ion beam to allow different regions of the ion beam to impinge upon the spaced charge-collecting conductive zones;

c) determining the charge on the conductive zones by sequentially discharging each of the spaced charge-collecting conductive zones and storing a charge signal related to the charge of each zone in a memory; and d) displaying a visual mapping of the ion beam intensity as a function of position within the ion beam based upon the charge signal for the array of spaced charge-collecting conductive zones.

15. The method of claim 14 wherein the moving step is performed by moving a linear array of conductive zones along a linear travel path to intercept different regions of the ion beam.

* * * * *